United States Patent [19]

Burroughes et al.

[11] Patent Number: 5,371,399

[45] Date of Patent: Dec. 6, 1994

[54] COMPOUND SEMICONDUCTOR HAVING METALLIC INCLUSIONS AND DEVICES FABRICATED THEREFROM

[75] Inventors: Jeremy Burroughes, Cambridge, United Kingdom; Rodney T. Hodgson, Ossining; David T. McInturff, New York, both of N.Y.; Michael R. Melloch; Nobuo Otsuka, both of West Lafayette, Ind.; Paul M. Solomon, Yorktown Heights, N.Y.; Alan C. Warren, Peekskill, N.Y.; Jerry M Woodall, Bedford, N.Y.

[73] Assignees: International Businesss Machines Corporation, Armonk, N.Y.; Purdue Research Foundation, Lafayette, Ind.

[21] Appl. No.: 104,423

[22] Filed: Aug. 9, 1993

Related U.S. Application Data

[63] Continuation of Ser. No. 715,757, Jun. 14, 1991, abandoned.

[51] Int. Cl.$^5$ ............................................. H01L 29/48
[52] U.S. Cl. ................................. 257/451; 257/453; 257/458; 257/473
[58] Field of Search ............... 257/472, 473, 451, 453, 257/485, 449, 184, 431, 458

[56] References Cited

U.S. PATENT DOCUMENTS

4,794,438 12/1988 Levinson et al. ..................... 357/29
4,816,183 3/1989 Bates, Jr. .......................... 252/501.1

OTHER PUBLICATIONS

Warren, A. C. et al., "Arsenic Precipitates . . . " Appl. Phys. Lett., 57(13), 24 Sep. 1990, pp. 1331-1333.
Sze, S. M., *Physics of Semiconductor Devices*, John Wiley, 1981, pp. 759, 711.
Webster's Ninth New Collegiate Dictionary 1984, pp. 365 & 1188.
"Characterization of an Optoelectroinc Terahertz Beam System", IEEE Transactions on Microwave Theory and Techniques, vol. 38, No. 11, Nov. 1990.
"New MBE Buffer Used to Elminate Backgating in GaAs MESFET's", By F. W. Smith et al. IEEE Electron Device Lett. vol. 9, No. 2, Feb. 1988.
"Infrared Response from Metallic Particles Embedded in a Single-Crystal Si Matrix: The Layered Internal Photoemission Sensor" by R. Fathauer et al Appl. Phys. Lett. 57(14) 1 Oct. 1990.
"Optically Induced Reordering of As Cluster Defects in Semiinsulating GaAs" by J. Jimenez et al., Cryst. Latt. Def. and Amorph. Mat., 1987, vol. 17, pp. 199-204.
"Effect of GaAs Buffer Layer Grown at Low Substrate Temperatures on a High-Electron-Mobility Modulation-Doped-Two-Dimensional Electron Gas", by R. Melloch et al., App. Phys Lett. 54(10) 6 Mar. 1989.
"Stuctural Properties of As-Rich GaAs Grown by Molecular Beam Epitaxy at Low Temperatures" by M. Kaminska et al., Appl. Phys Lett. 54(19) 8 May 1989.
"Bistability and Metastability of the Gallium Vacancy in GaAs: The Actuator of E12?" by G. Baraff et al., Physical Review Letters, vol. 55, No. 21, 18 Nov. 1985.
"GaAs Field-Effect Transistor Properties, As Influenced by the Local Concentrations of MidGap Native Donors and Dislocations" by P. Dobrilla Appl. Phys. Lett 47(6) 15 Sep. 1985.
"Optical Mapping of Residual Stress in Czochralski Grown GaAs" by P. Dobrilla et al., App. Phys. Lett 48(19) 12 May 1986.

*Primary Examiner*—Sara W. Crane
*Attorney, Agent, or Firm*—Perman & Green

[57] ABSTRACT

A doped or undoped photoresponsive material having metallic precipitates, and a PiN photodiode utilizing the material for detecting light having a wavelength of 1.3 micrometers. The PiN photodiode includes a substrate having a first compound semiconductor layer disposed thereon. The PiN photodiode further includes an optically responsive compound semiconductor layer disposed above the first compound semiconductor layer. The optically responsive layer includes a plurality of buried Schottky barriers, each of which is associated with an inclusion within a crystal lattice of a Group III-V material. The PiN device also includes a further compound semiconductor layer disposed above the optically responsive layer. For a transversely illuminated embodiment, waveguiding layers may also be disposed above and below the PiN structure. In one example the optically responsive layer is comprised of GaAs:As. The GaAs:As exhibits a very low room temperature dark current, even under forward bias conditions, and a responsivity to 1.3 micrometer radiation modulated at frequencies greater than 1 GHz.

41 Claims, 6 Drawing Sheets

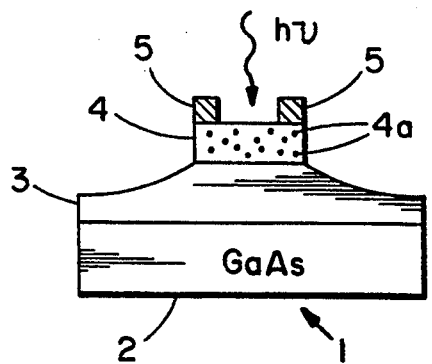
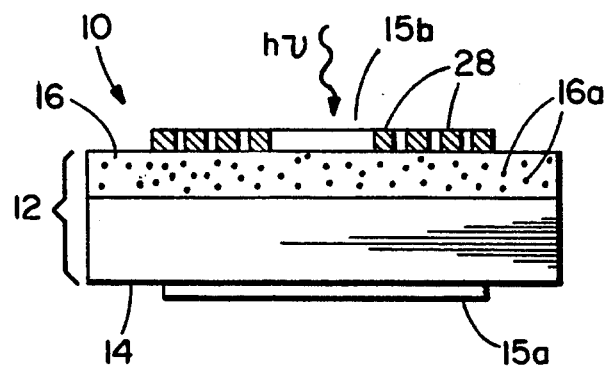
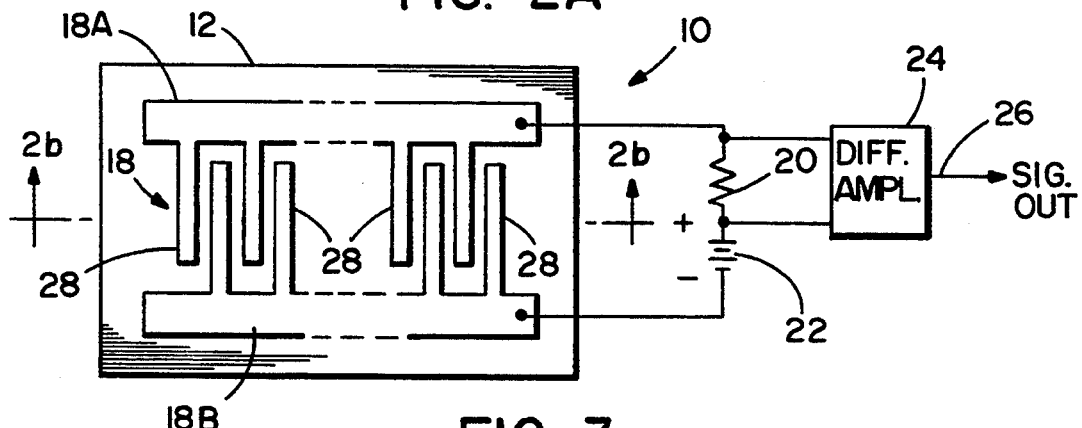
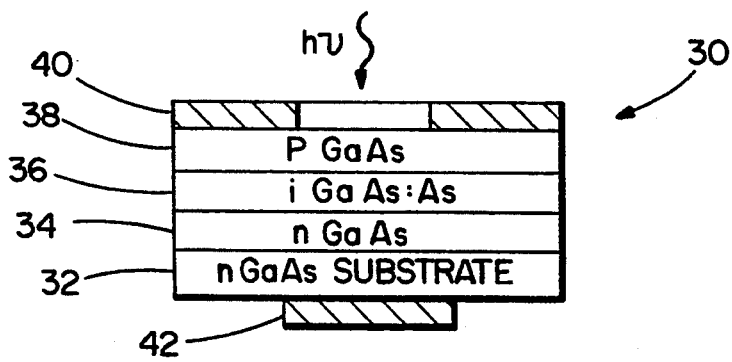
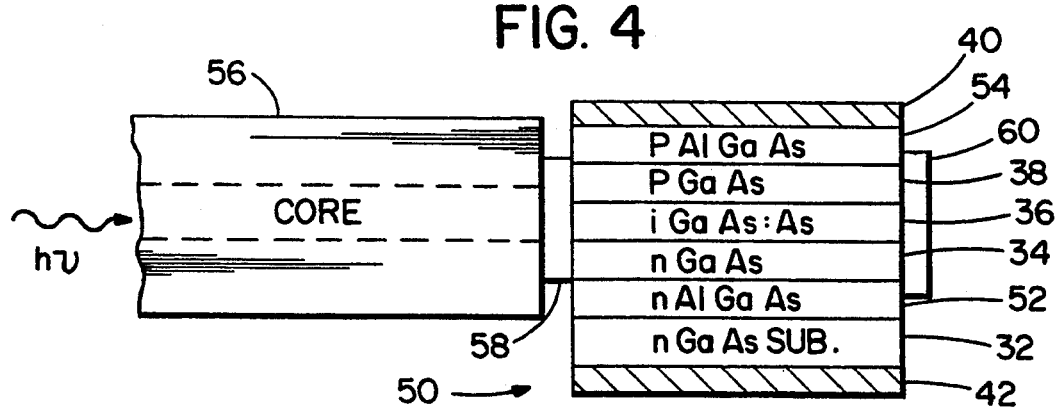

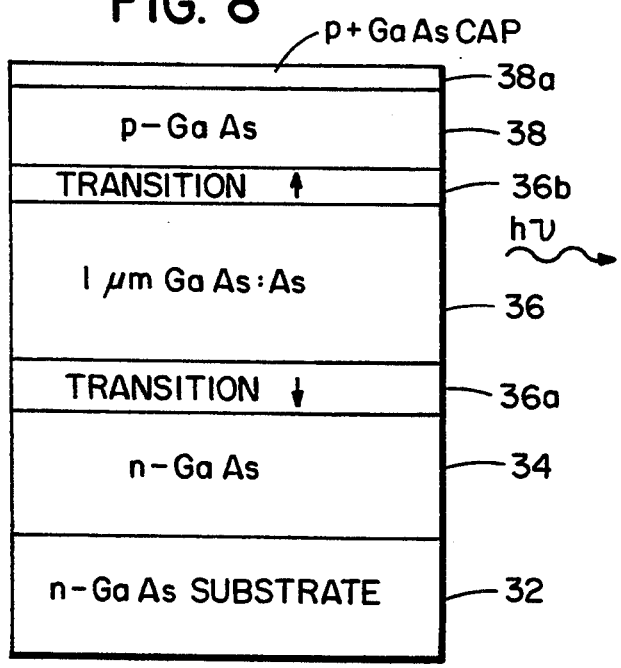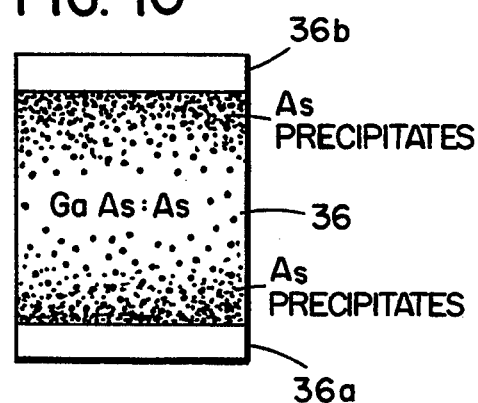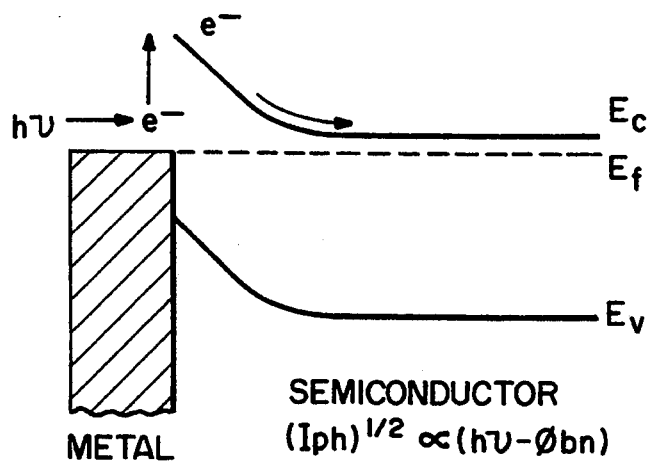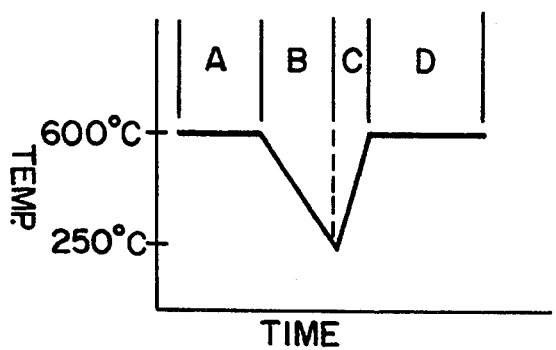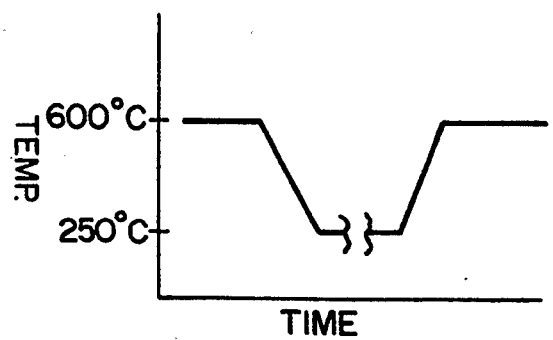

COMPOUND SEMICONDUCTOR HAVING METALLIC INCLUSIONS AND DEVICES FABRICATED THEREFROM

"This invention was made with Government support under grant N00014-89-J-1864 awarded by the Office of Naval Research. The Governement has certain rights in the invention."

This is a continuation of copending application(s) Ser. No. 07/715,757 filed on Jun. 14, 1991; now abandoned.

FIELD OF THE INVENTION

This invention relates generally to composite semiconductor materials and to devices fabricated therefrom and, in particular, to Group III-V material and to radiation detectors fabricated from the material.

BACKGROUND OF THE INVENTION

Many conventional optical receivers are hybrid circuits having silicon-based electronics and associated Ge or GainAsP-based photonics. These conventional receivers are often designed to detect the wavelengths in the range of 1.3 micrometers to 1.5 micrometers. The detection of radiation having these wavelengths is especially desirable in that high speed fiber optic-based communications networks employ these wavelengths.

However, the use of hybrid devices is undesirable for a number of reasons, including high cost, large package size, speed limitations, and decreased reliability. A preferred optical receiver would include integrated electronic and photonic devices fabricated from one material, or from lattice-matched heterostructures such as InP/InGaAsP and InP/InAlAsP. Unfortunately, progress in the development of InP-based integrated receivers has been slow.

One attractive alternative to InP-based material is GaAs. Because of the considerable effort that has been directed towards the development of this material, high performance GaAs-based integrated electronic circuits and receivers may now be fabricated reliably. Unfortunately, conventional GaAs detectors are not sensitive to radiation in the 1.3 micrometer to 1.6 micrometer range of interest.

As such, it is one object of this invention to provide a room temperature GaAs-based optical receiver that is sensitive to radiation in the 1.3 micrometer to 1.6 micrometer range of interest.

Recently, it has been reported that GaAs grown at 200°-250° C. yields a substrate which virtually eliminates the effects of backgating and sidegating in GaAs circuits. Backgating is a dependence of a transistor's drain-to-source current on the substrate bias, while sidegating is a dependence of the transistor's drain-to-source current on the bias of a proximate device.

Specifically, in an article entitled "New MBE Buffer Used to Eliminate Backgating in GaAs MESFET's", IEEE Electron Device Letters, Vol. 9, No. 2, February 1988, F. W. Smith et al. disclose a buffer layer that eliminates backgating between MESFET's fabricated in active layers grown upon the buffer layer. The buffer layer was grown by molecular beam epitaxy (MBE) at low substrate temperatures (150°-300° C.) using Ga and $As_4$ beam fluxes.

In an article entitled "Infrared Response from Metallic Particles Embedded in a Single-Crystal Si Matrix: The Layered Internal Photoemission Sensor" Appl. Phys. Lett. 57 (14) 1 October 1990, by R. W. Fathauer et al. there is disclosed the 77K detection of infrared radiation at wavelengths of 1-2 micrometers with a device referred to as a layered internal photoemission sensor. The device structure was grown by a Si MBE technique to incorporate epitaxial $CoSi_2$ particles, the particles having dimensions of 10-50 nanometers. Radiation absorbed by the particles is said to photoexcite carriers into a surrounding single-crystal, but highly defected, silicon matrix. A peak quantum efficiency of 1.2% was measured. However, this device exhibited, at 77K, a substantial dark current of 0.6 $mA/cm^2$ at one volt of reverse bias. The device is not reported to operate at room temperature (295K).

In an article entitled "Effect of GaAs Buffer Layer Grown at Low Substrate Temperatures on a High-Electron-Mobility Modulation-Doped Two-Dimensional Electron Gas", Appl. Phys. Lett. 54 (10) 6 March 1989, by R. Melloch, et al., sidegating in GaAs integrated circuits is said to be eliminated in a MBE-grown structure with the incorporation of a GaAs buffer layer grown at low substrate temperatures (200°-300° C.). The low temperature buffer layer is referred to as a LTBL. No deleterious effect on mobility or carrier density was said to be observed with the incorporation of the LTBL.

In an article entitled "Structural Properties of As-Rich GaAs Grown by Molecular Beam Epitaxy at Low Temperatures", Appl Phys Lett 54 (19) 8 May 1989, by M. Kaminska et al., it is reported that GaAs layers grown by MBE at substrate temperatures between 200° and 300° C. were studied using transmission electron microscopy (TEM), x-ray diffraction, and electron paramagnetic resonance (EPR) techniques. High-resolution TEM cross-sectional images are said to show a high degree of crystalline perfection of these layers. For a layer grown at 200° C. and unannealed, x-ray diffraction revealed a 0.1% increase in the lattice parameter in comparison with bulk GaAs. For the same layer, EPR was said to detect arsenic antisite donor defects (arsenic atoms on a Ga site) with a concentration as high as $5 \times 10^{18} cm^{-3}$. This observation is said by the authors to be the first observation of antisite donor defects in MBE-grown GaAs. These results are said to be related to off-stoichiometric, strongly As-rich growth, that is possible only at such low growth temperatures. These findings are said to be relevant to the specific electrical properties of low-temperature MBE-grown GaAs layers.

In an article entitled "Optically Induced Reordering of As Cluster Defects in Semiinsulating GaAs", Cryst. Latt. Def. and Amorph. Mat., 1987, Vol. 17, pp. 199-204, by J. Jimenez et al., the EL2 level in GaAs is said to be associated with the existence of arsenic-rich aggregates. The EL2 level is a main midgap energy level that ensures the compensation of background shallow acceptors. This level is characterized by the existence of metastable state, which is induced by optical excitation at low temperature (T<120 K). These authors report that the recovery of the normal state cannot be accomplished by optical excitation, but that a recovery of the photoconductivity signal is observed. An analysis of this phenomenon is said to reveal the existence of more than only a metastable state induced by 1-1.25eV photons; these results are said to be based on an optically induced reordering of arsenic-rich aggregates when AsGa antisite donors are photoionized. Small differences in the AsGa complexes, inside the aggregates, are said to produce significant differences in metastability.

What is not taught by these journal articles, and what is thus another object of the invention to provide, is a GaAs material that includes metallic precipitates that overcomes the deficiency of conventional GaAs material, enabling the room temperature detection of radiation in the 1.3 micrometer to 1.6 micrometer range of interest.

It is another object of this invention to provide embodiments of photodetectors comprised of GaAs material that include As precipitates or inclusions (GaAs:As) for detecting radiation having a wavelength equal to or less than approximately 1.6 micrometers.

It is a further object of the invention to provide a P-intrinsic-N (PIN) photodiode comprised of GaAs:As material that exhibits a level of quantum efficiency (QE) and dark current suitable, at room temperature, for detecting radiation in the 1.3 micrometer to 1.6 micrometer range of interest.

It is one further object of the invention to provide an intrinsic-like body of a compound semiconductor that contains a significant concentration of acceptor or donor dopants while maintaining a substantially nonconducting electrical characteristic.

SUMMARY OF THE INVENTION

The foregoing and other problems are overcome and the objects of the invention are realized by a compound semiconductor material having inclusions dispersed within a crystal lattice of the semiconductor material, the inclusions having a Schottky barrier height of a magnitude sufficient for generating detectable charge carriers in response to electromagnetic radiation having a wavelength equal to or less than approximately 1.6 micrometers.

The compound semiconductor material, in one embodiment of the invention, is comprised of GaAs, and the inclusions are comprised of elemental As that precipitates out of the GaAs during a high temperature anneal following a low temperature growth of the GaAs. The inclusions have a radius within a range of approximately 20 angstroms to approximately 200 angstroms and are found to be present in a concentration of approximately $10^{16}$ precipitates $cm^{-3}$ to approximately $10^{18}$ precipitates $cm^{-3}$.

In other embodiments of the invention the inclusions are comprised of Cr or Al.

There are also disclosed embodiments of optically responsive devices each of which includes an active radiation absorbing region comprised of a compound semiconductor, either doped or not doped, having a plurality of inclusions contained therein, the inclusions functioning as buried Schottky barriers for rendering the compound semiconductor material substantially nonconducting in the absence of illumination. As a result, the devices exhibit a very low dark current, even when subjected to a forward bias at room temperature.

One device embodiment is that of a PiN photodiode operable for detecting light at a wavelength of 1.3 micrometers. The PiN photodiode includes a substrate having a first compound semiconductor layer disposed thereon. The first compound semiconductor layer has a first type of electrical conductivity. The PiN photodiode further includes a doped or a not intentionally doped, non-conducting compound semiconductor layer disposed above the first compound semiconductor layer. In accordance with the invention, this compound semiconductor layer includes a plurality of buried Schottky barriers, each of which is associated with an inclusion within a crystal lattice of a Group III-V material. The PiN device further includes a second compound semiconductor layer disposed above the compound semiconductor layer that contains the inclusions. The second compound layer has a second type of electrical conductivity that is opposite the first type. For a transversely illuminated embodiment, waveguiding layers may also be disposed above and below the PiN structure. An anti-reflective (AR) coating may be included, as may be a reflective coating to cause nonabsorbed radiation to make at least a second pass through the inclusion-containing compound semiconductor layer.

Embodiments of photoconductive devices are also described.

In one presently preferred embodiment of the invention the inclusion-containing compound semiconductor layer is comprised of GaAs that has elemental As precipitates contained therein. This material is referred to as GaAs:As. Presently preferred methods of fabricating the GaAs:As material and devices containing are also described.

BRIEF DESCRIPTION OF THE DRAWING

The above set forth and other features of the invention are made more apparent in the ensuing Detailed Description of the Invention when read in conjunction with the attached Drawing, wherein:

FIG. 1 is a cross sectional view of a photodetector having a doped GaAs:As active layer that is constructed in accordance with the invention;

FIG. 2a is a plan view, not to scale, showing a Metal-Semiconductor-Metal (MSM) photodetector embodiment that is constructed in accordance with the invention;

FIG. 2b is a cross-sectional view, not to scale, taken along the section line 2b-2b of the photodetector of FIG. 2a;

FIG. 3 is a cross-sectional view, not to scale, of a top illuminated PiN photodiode constructed in accordance with the invention;

FIG. 4 is a cross-sectional view, not to scale, of a transversly-illuminated PiN photodiode constructed in accordance with the invention;

FIG. 6c illustrates the amplitude spectrum of the measured pulse shown in FIG. 6a;

FIG. 8 illustrates in greater detail a cross-section, not to scale, of the PiN region of the device of FIG. 3;

FIG. 9 is an energy band diagram showing the operation of the Schottky barrier at the metallic precipitate and semiconductor boundary, wherein $E_c$ indicates the conduction band energy, $E_f$ indicates the Fermi energy level, and wherein $E_v$ indicates the valence band energy;

FIG. 10 is a cross sectional view of an embodiment of a GaAs:As active layer having a predetermined spatial concentration of the As precipitates;

FIG. 11a is a graph illustrating a temperature profile employed during the growth of the device of FIG. 4, while FIG. 11b is a graph illustrating a modification to the temperature profile of the graph of FIG. 11a so as to obtain a thicker GaAs:As active region as in the device of FIG. 8.

DETAILED DESCRIPTION OF THE INVENTION

Figure 5A:
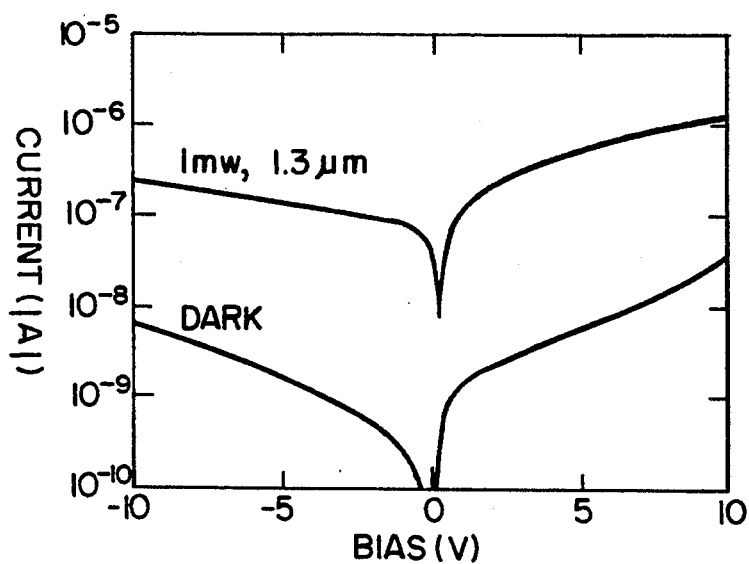
FIG. 5a is an I/V curve showing the device current output as a function of bias potential for both the illuminated and the unilluminated case.

The ensuing description of the present invention is presented in the context of two distinct physical mechanisms, both of which rely on the inclusion of metallic precipitates within a host compound semiconductor material. A presently preferred embodiment is disclosed to be elemental arsenic precipitates that are embedded within the crystalline structure of a GaAs host.

It is noted that as employed herein a compound semiconductor material is considered to be a material containing a plurality of elements having cation and anion nature whose chemical formula is described by a rule that the sum of the mole fractions of anion elements equals the sum of the mole fraction of cation ions. As an example of Group III-V compound semiconductor materials, for the binary compound GaAs the cation is Ga and the anion is As. For the ternary compound $Al_xGa_{(1-x)}As$, Al and Ga are cations and the anion is As. Another example is GaInAsP, where Al and Ga are cations and As and P are anions. A compound semiconductor material may also be comprised of Group II-VI elements, such as CdTe and HgCdTe. For the former case, Cd is the cation and Te is the anion.

A first physical mechanism operates with incident light having energies less than a bandgap energy of the host compound semiconductor material. For this condition, charge carriers are excited from the precipitate into a band of the host. An electric field applied across the host sweeps out these carriers, resulting in a detectable electrical signal.

A second physical mechanism operates with incident light having energies greater than the bandgap energy of the host compound semiconductor material. For this case, photo-generated charge carriers are excited in the host, with one type of charge carrier (holes for n-type host material) being absorbed by the precipitates. The absorption of holes forward biases a precipitate and collapses a depletion region associated with the precipitate. This results in a significant increase in electrical conductivity through the host compound semiconductor material.

In one embodiment of the invention the host material is doped, and provides photoconductive gain and high sensitivity. In another embodiment of the invention the host material is not doped, and provides for very high speed operation.

As will be described, a significant dopant concentration can be added to the host material (for example $10^{16}$ atoms/cm$^3$ to $10^{18}$ atoms/cm$^3$) without increasing the electrical conductivity of the host material. This is due to the depletion regions associated with the metallic precipitates that are embedded within the host material.

The above set forth mechanisms are exploited by the present invention to provide photovoltaic and photoconductive devices having improved and novel properties. A detailed description of the present invention is now provided.

By way of introduction, and referring to FIG. 9 in regard to the first physical mechanism described above, the embodiments of the invention described in detail below exploit a discovery by the inventors that Arsenic (As) precipitates within a Gallium Arsenide (GaAs) crystalline matrix function as buried Schottky barriers, each having a barrier height of approximately one-half the bandgap of GaAs, or approximately 0.7eV. As a result, when photons of energy greater than 0.7 eV, corresponding to wavelengths shorter than 1.75 micrometers, strike the As precipitates, carriers are excited from the As into a band of the GaAs.

The application of an electric field during photonic excitation sweeps out these carriers and causes a photocurrent to appear in an external circuit. As a result of this important discovery, it has been found that GaAs containing As precipitates (GaAs:As), when used as, by example, the intrinsic layer (i-layer) of a PiN photodiode, provides a photodetector that is responsive to light having a wavelength of 1.3 micrometers. Furthermore, detection occurs at room temperature (295K) and at modulation frequencies above $10^9$ Hz (1 GHz). Measurements performed on a PiN photodetector embodiment of the invention show responsivity to a modulation frequency of 2 GHz (probe limited). For a MSM embodiment described below a modulation frequency of $50 \times 10^9$ Hz has been observed. Also, the photodetector of the invention exhibits a very low dark current at normal operating temperatures and over a range of bias potentials.

As employed herein, and for the case of GaAs, intrinsic is intended to mean that the GaAs material is substantially nonconducting, although either acceptor or donor dopants may be present in the material.

Figure 7:
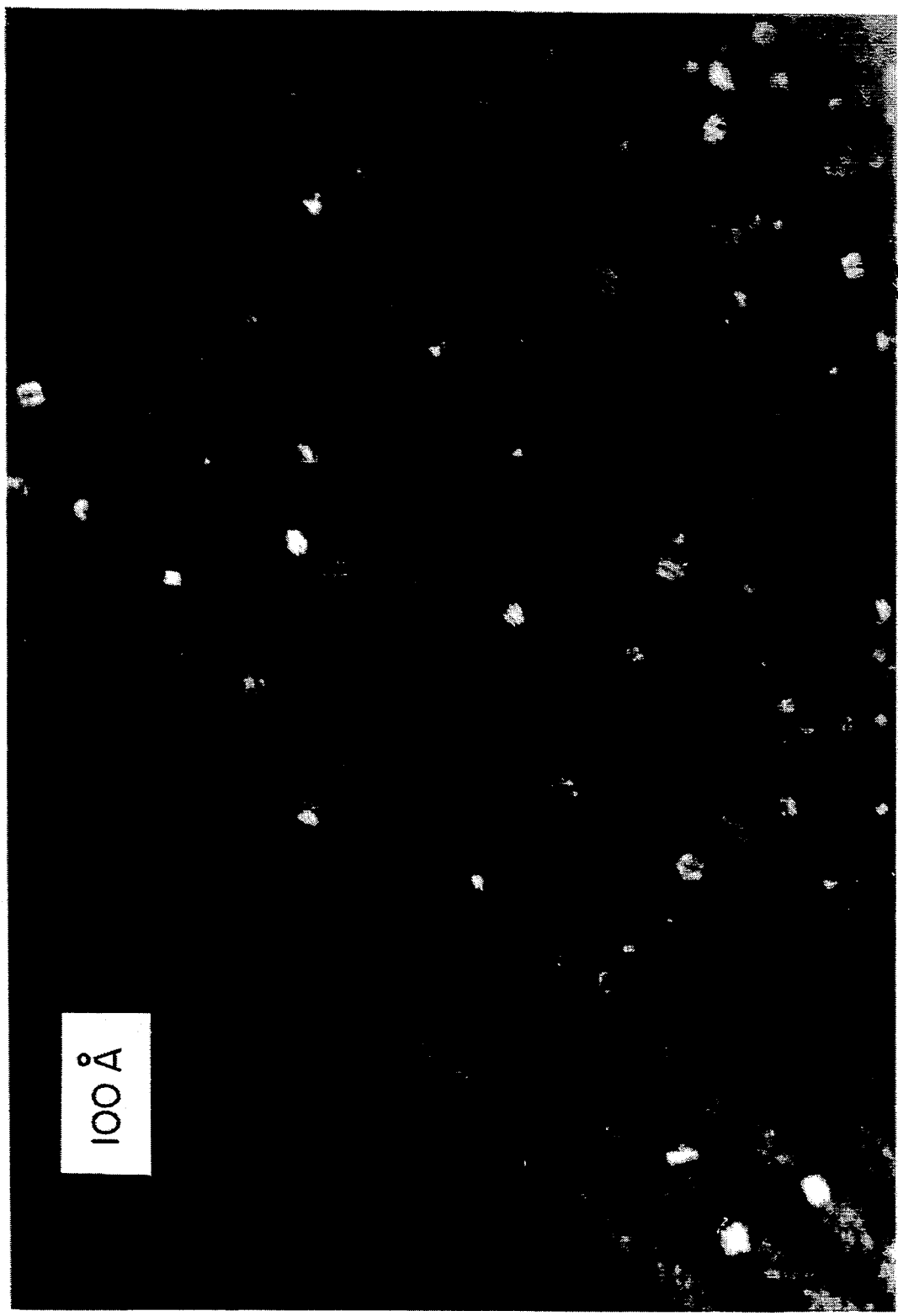
FIG. 7 is a dark field (TEM) photomicrograph showing a uniform distribution of As inclusions within crystalline GaAs grown in accordance with a method of the invention.

Referring to the photomicrograph of FIG. 7, in conjunction with the energy band diagram of FIG. 9, the As precipitates may be thought of as functioning as ultra-small FET gates which pinch off the otherwise conductive regions between the precipitates. The material is doped such that, in the absence of illumination, the depletion regions are just overlapping. When illuminated with light having energy greater than the semiconductor bandgap energy, the depletion regions around the As precipitates decrease in size, and the composite structure becomes electrically conducting. This occurs because of a diffusion of photogenerated charge carriers, specifically holes, into the precipitates. The capture of holes by the precipitates forward biases the precipitates, in a manner analogous to a forward biased FET. Because of the close spacing between precipitates, an effect is achieved of many parallel FET channels that are closely packed within a small volume of material. As a result of this effect, the structure exhibits a very low resistance when illuminated and a very high resistance, due to overlapping depletion regions, when non-illuminated. Furthermore, the small size of the precipitates does not cause any appreciable shadowing of the incident radiation, so that the collection of light is very efficient. Depletion layer widths are small so that carrier collection times by the precipitates are very short, resulting in a very rapid turn-on of the conductivity. However, turn-off times are governed by emission of carriers from the As precipitates, and thus require a greater amount of time.

Figure 12B:
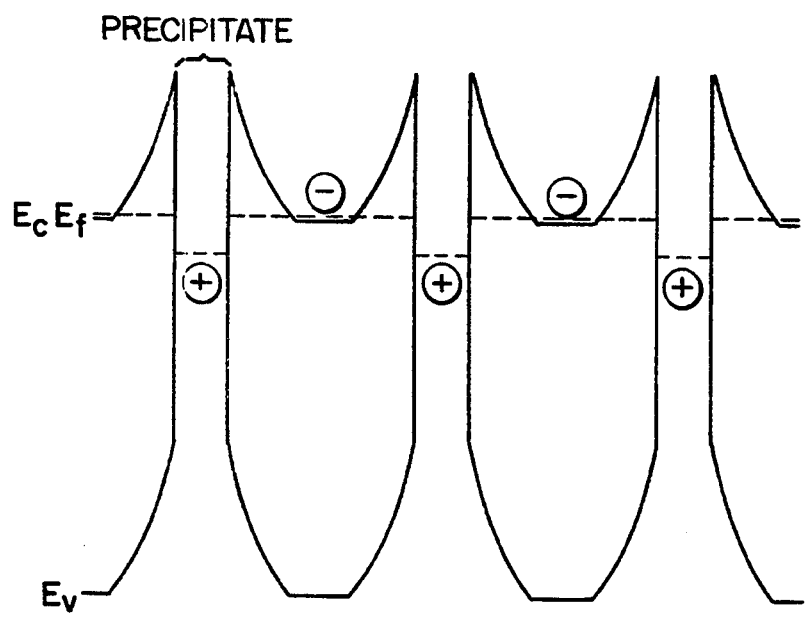
FIGS. 12a and 12b are diagrams showing the band structure that results from the inclusion of As precipitates within n-doped GaAs host material.
Figure 12A:
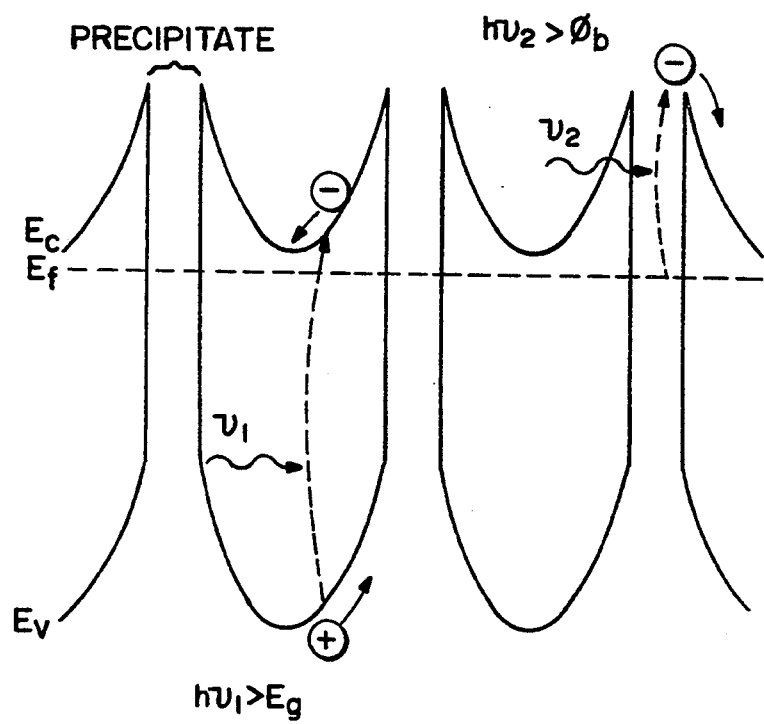

A result of the capture of the minority carriers is gain, in an analogous manner to that obtained with an externally biased gate of a FET. Operationally, if the doped material is excited with light of less than the bandgap energy of the material, a majority carrier (electron for n-type material) is emitted over barrier into the conduction band of the GaAs, leading to photoconductivity. If the doped material is instead excited with light of greater than the bandgap energy of the material, a minority carrier (hole for n-type) is swept into an As precipitate. This also results in photoconductivity. Hence, for light having energy of either less than or greater than the bandgap energy of the doped host material, the device acts in a manner analogous to a FET (i.e. exhibits gain). In this regard reference is made to the band structure diagrams of FIGS. 12a and 12b. FIG. 12a illustrates photoconductor absorption mechanisms and FIG. 12b illustrates the FET-like photoconductor "biasing" due to illumination.

The performance of the optically responsive devices employing the first physical mechanism described above is a significant improvement when compared with the above mentioned photodetector constructed of Si having $CoSi_2$ precipitates within the undoped intrinsic layer. As will be remembered, this Si-based device detects 1.3 micrometer light at 77K, and not at 295K. Even at 77K, the Si-based device exhibits a significantly high dark current. Also, the Si-based device is not reported to exhibit high speed properties.

The buried Schottky barriers that are a feature of the present invention are created in a controlled manner through a low temperature GaAs deposition process, followed by a higher temperature anneal. The resulting material is structurally superior to that of the $CoSi_2$ precipitates in Si, which result in heavily defected Si material that includes such defects as stacking faults and twins.

Furthermore, it is important to note that the As precipitates are a separate, distinguishable phase as compared to the GaAs. That is, the novel material of the invention is a two-phase system wherein the As precipitates are a separate phase that is thermodynamically, physically, and electrically distinguishable from the As of the GaAs material.

The invention will now be more fully described with respect to several presently preferred embodiments. In addition, a presently preferred process for growing the GaAs:As material is described.

Referring to FIG. 1 there is shown a first embodiment of the invention in which the device is illuminated with photons of energy greater than bandgap of the compound semiconductor material. A photoconductor 1 is formed on a semi-insulating GaAs substrate 2. On a surface of the substrate 2 is grown a suitable buffer layer 3. In accordance with this embodiment of the invention a doped, low temperature buffer layer (LTBL) 4 is formed upon the buffer layer 3, and ohmic contacts 5 are provided for coupling to external circuitry. The LTBL 4 is the active region of the photoconductor 1 and includes, in accordance with the invention, metallic precipitates 4a, such as As, that are distributed therethrough. The precipitates 4a are also referred to herein as "clusters". The doping is preferably made n-type because of the larger Schottky barrier heights to, and higher mobilities of, n-type GaAs, although p-type GaAs may also be employed. One suitable n-type dopant is Si, having a concentration of approximately $10^{18}/cm^3$. One suitable p-type dopant is Be, having a concentration of approximately $10^{18}/cm^3$.

The cluster density $n_{CL}$ (or the cluster spacing d) and the cluster radius $r_o$ in the active layer may be controlled by varying the epitaxial growth conditions (temperature, As/Ga ratio) and/or the post-growth annealing cycle (temperature and time).

The active layer 4 thickness (t) is preferably comparable to the absorption depth of the light, or at least approximately 200 nanometers. The radius ($r_s$) of the depletion layer around a particular cluster can be obtained from:

$$\phi_b - V = \frac{eN_d}{6\epsilon} \left[ \frac{2r_s^3}{r_0} + r_0^2 - 3r_s^2 \right], \quad (1)$$

where V is the forward photo-voltage developed between the cluster and the bulk GaAs that surrounds the cluster. The conductivity of the layer is governed by percolation as modelled, for example, by J. N. Roberts and L. M. Schwartz in "Grain Consolidation and Electrical Conductivity in Porous Media" Phys Rev B31, 5990 (1985). To achieve a maximum radiation detection effect the GaAs:As active layer is preferably operated so that it is just cut-off, i.e. $r_s = d/\sqrt{2}$, assuming a simple cubic arrangement for the clusters. In practice, the cut-off point is a function of cluster distribution and may be best determined empirically. The doping level is made as high as possible to ensure a low on-resistance, yet low enough to avoid tunnelling. For example, for $r_o = 3$ nanometers and $\phi_b = 0.8$ eV, it can be shown that a doping level of $5 \times 10^{17} cm^{-3}$ is suitable when using an illumination of $>0.5W/cm^2$. Solving Equation (1) there is derived $r_s = 23nm$, $d = 33nm$ and $n_{CL} = 2.8 \times 10^{16} cm^{-3}$. It should be noted that Equation (1) does not take degeneracy and Debye spreading into account. As a result, the value of $r_s$ is over-estimated and that of $n_{CL}$ is under-estimated. Under illumination, a photo-voltage of approximately 0.2V is developed.

This photo-voltage acts to reduce $r_s$ to 21nm and the conductivity of the GaAs:As active layer increases to approximately 6% of the layer's bulk value. The resistance of the active layer is thus approximately 4.2 Kohms/$cm^2$. For 1V applied between contacts 5 that are separated by three micrometers, the photo-current is 40mA/mm, corresponding to a photo-conductive gain (neglecting shadowing and reflections) of approximately $10^6$.

Using the familiar expression:

Photo-conductive Gain = lifetime/transit time, an effective carrier lifetime of 30 microseconds is obtained. This lifetime is significantly longer than the electron-hole recombination lifetime in bulk GaAs of approximately 0.1 microsecond at an electron concentration of $10^{17}/cm^3$.

As a result, the GaAs:As material of the invention provides GaAs photoconductors having superior conductivity modulation and higher photoconductive gains than bulk GaAs material. Furthermore, the gain and lifetime properties of the material may be tailored by varying the doping and cluster spacing in accordance with well-known FET modelling procedures.

Having described in detail a structure wherein the GaA:As is doped such that the precipitate depletion regions are just overlapping (i.e. pinched off), reference is next made to FIGS. 2a and 2b wherein there is shown a MSM embodiment of the invention wherein the depletion regions have a substantial overlap (i.e. well beyond pinch-off). A photodetector 10 includes a semiconductor body portion 12 comprised of a GaAs substrate 14 and, in accordance with the invention, an overlying doped or undoped, non-conductive GaAs:As layer 16. The thickness of the doped or undoped, non-conductive layer 16 is approximately one micrometer. The layer 16 includes a plurality of As precipitates 16a each having a diameter of approximately 20–200 angstroms. For this embodiment the As precipitates 16a are uniformly distributed throughout the layer 16. However, and as will be described below, it is within the scope of the invention to spatially vary the distribution and concentration of the precipitates 16a within the layer 16.

Formed upon an upper surface of the layer 16 are electrodes 18, specifically of a pair of interdigitated electrodes 18a and 18b. The electrodes 18a and 18b each have a plurality of spaced apart fingers 28.

Although not forming a part of the present invention there is coupled to the electrodes 18 a load resistance 20 and a source of bias potential 22. A readout circuit, such as a differential amplifier 24, is coupled across the load resistance 20 and provides a signal output 26 having a magnitude that is a function of the amount of optical radiation that is absorbed within the layer 16.

For the embodiments of FIGS. 2a and 2b a reflector 15a is preferably employed to cause the light to make a double pass through the material. The reflector may be of the Bragg reflecting-type using multi-layered stacks of semiconductor material, as is well known in the art. An antireflective (AR) coating 15b at the radiation receiving surface is also preferred to further increase the efficiency of the device. A quarter wavelength AR coating is applied using standard deposition techniques, such as sputtering, of a material such as $TiO_2$.

A further embodiment of the invention is shown in the cross-sectional view of FIG. 3. This embodiment provides a PiN photodiode 30 comprised of an n-type GaAs substrate 32, an n-type GaAs layer 34, a doped or undoped, non-conductive layer 36 comprised of, in accordance with the invention, GaAs:As, and an overlying p-type GaAs layer 38. An apertured top-side electrode 40 is provided, as is a bottom side contact 42. Incident radiation enters through the aperture of the electrode 40 and is absorbed within the GaAs:As layer 36. As in the embodiment of FIGS. 2a and 2b the layer 36 has a thickness of approximately one micrometer and includes the As precipitates, each having a diameter within a range of approximately 20 angstroms to approximately 200 angstroms.

Figure 5B:
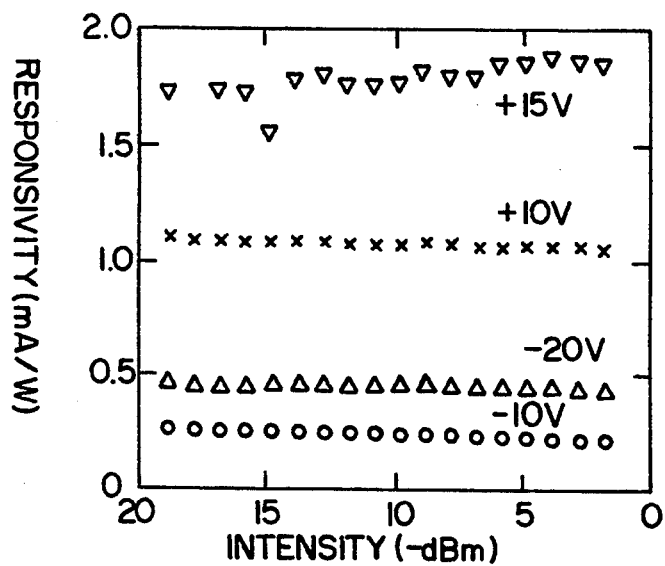
FIG. 5b is a plot showing device responsivity at different bias potentials as a function of light intensity.
Figure 5C:
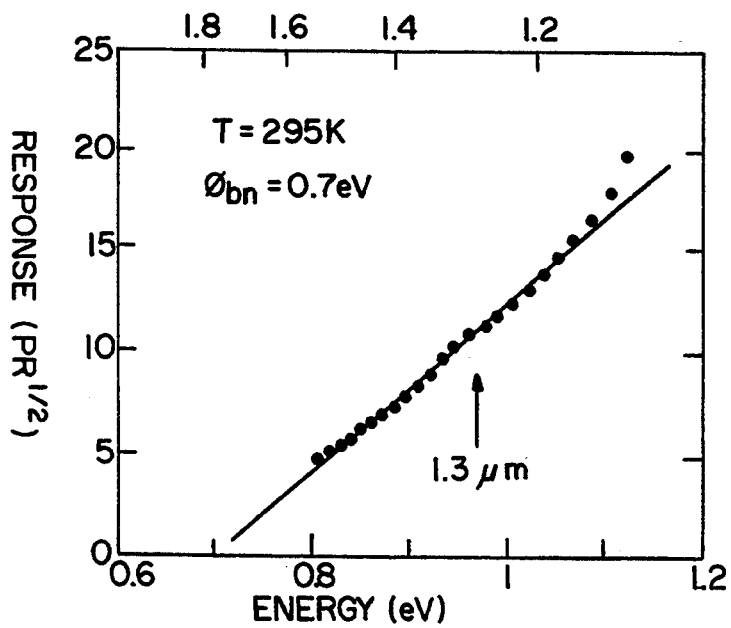
FIG. 5c shows the response characteristic of the device as a function of energy and wavelength of the incident radiation.

The performance of the photodetector 30 is illustrated in FIGS. 5a, 5b, and 5c. The electrical performance of the PiN device 30 in response to one milliWatt of incident light, having a wavelength of 1.3 micrometers, shows I/V characteristics as depicted in FIG. 5a, with the lower curve showing the unilluminated (dark) case. As can be seen from the upper curve, the PiN device 30 does not turn on hard in the forward bias direction, as would a conventional PiN photodiode. This behavior suggests that the As clusters in the GaAs:As i-layer 36 function as current sinks. Although the device exhibits some asymmetry and increased current in the forward-biased direction, detector operation with a bias at either polarity is not precluded.

The I/V characteristics of FIG. 5a suggest that absorption is a one-carrier internal photoemission process and is not due to emission from deep traps in the GaAs:As material. An extrapolated barrier height for this internal emission is approximately 0.7 eV, which is consistent with the barrier height of As to GaAs, as observed in conventional planar Schottky structures.

Significantly, the device 30 exhibits a low level of dark I/V leakage current. The dark current is approximately $5 \times 10^{-9}$ Amp at $-10V$ bias for a 100 micrometer diameter device. This equates to 60 microamps/cm², which is a significant improvement over the large dark current obtained by Fathauer et al. for the $CoSi_2$ device referred to above. The $CoSi_2$ device, it will be remembered, is not reported to operate at room temperature. Even at 77K this device exhibited leakage currents of 600 microamps/cm² with a reverse bias of 1V. However, even with a forward bias of 10V, the GaAs:As PiN device 30 of the invention exhibits only 300 microamp/cm² of dark current at room temperature. This amount of dark current is considered to be acceptable for typical applications.

FIG. 5b illustrates the responsivity of the PiN device 30 in response to illumination with radiation having a wavelength of 1.3 micrometers, at various intensity levels and under both forward and reverse bias conditions.

FIG. 5c shows the photo-response of the PiN photodiode at room temperature and for radiation having wavelengths equal to or less than approximately 1.6 micrometers. As can be seen, the square root of the photocurrent ($PR^{\frac{1}{2}}$) is approximately proportional to the photon energy above threshold and is characteristic of the normal internal photoemission behavior of illuminated metal-semiconductor interfaces, as shown in FIG. 9. The data of FIG. 5c strongly indicates that the As precipitates function as buried Schottky barriers.

It can also be seen in FIG. 5c that the buried Schottky barriers provide response to photon energies from the barrier height of GaAs to the bandgap of GaAs where band-to-band absorption becomes dominant.

It should be noted that a control device, fabricated as above but without As inclusions, was found to exhibit a negligible change in output upon illumination with 1.3 micrometer light. This is the expected result in that, as was stated above, conventional GaAs material does not exhibit a response to light of this wavelength.

It was determined that approximately 3% to 5% of the 1.3 micrometer radiation is absorbed or scattered in the one micrometer thick i-layer 36. If it is assumed that the loss is due to low absorption, there is obtained an internal QE of approximately 2.5%. This efficiency is a factor of two times greater than that of the above-mentioned $Si:CoSi_2$ photodiodes operated at 77K. The forward bias room temperature responsivity of the GaAs:As device of the invention is also greater, producing one milliamp at +10V bias.

FIG. 8 illustrates in greater detail a cross-section of the PiN region of the device of FIG. 3. Upon the surface of the n+ GaAs substrate 32 the n+ GaAs layer 34 is grown at 600° C. so as to eliminate effects from the substrate/epi interface. Next, there is grown at 225° C. the one micrometer thick undoped GaAs intrinsic layer (i-layer) 36, followed by the p+ GaAs layer 38, which is grown at 600° C. No growth interruption is employed, resulting in "temperature-grade" regions 36a and 36b having thicknesses of 0.25 and 0.05 micrometers, respectively. The temperature grade regions 36a and 36b are employed to provide a smooth transition between the material grown under high temperature and the material grown under low temperature. The structure experiences a 600° C. anneal during the layer 38 growth, and an additional 30 minutes of anneal in an As$_2$ beam after growth has been completed.

In accordance with an aspect of the invention, this process has been found to produce a high quality GaAs matrix within the i-layer 36, the matrix containing As precipitates having diameters within a range of approximately 20 angstroms to approximately 100 angstroms with a density of approximately $10^{17}$ precipitates/cm$^3$ to $10^{18}$ precipitates/cm$^3$.

A Rapid Thermal Anneal (RTA) technique has been found to increase the precipitate diameter range to approximately 200 Angstroms, with a corresponding decrease in concentration to approximately $10^{16}$ precipitates cm$^{-3}$.

For fabrication of the device of FIG. 3, a 100 micrometer diameter mesa may be employed to isolate device p-contacts and define the device active area. After re-filling with evaporated SiO$_x$, Ti/Pt/Au ring contacts and pads are patterned for the front contact 40 and a blanket Au/Ge/Ni layer is deposited so as to form the back-side-n-contact 42. With this geometry, illumination is provided from the top via the aperture in the ring contact 40.

FIG. 4 shows a further embodiment of the invention that has a higher QE than the device of FIG. 3. Specifically, there is shown a GaAs:As laterally-coupled PiN photodiode 50, wherein the incident light is channeled into the i-layer 36 in-plane. The heterostructure for this laterally-coupled PiN device includes Al$_x$Ga$_{(1-x)}$As (x=0.3) cladding layers 52 and 54 positioned above and below the active low-temperature grown "i" layer 36 for providing waveguiding thereto. An optical fiber 56 is coupled to the device, preferably through an AR coating 58, for coupling light into the PiN device 50. One suitable AR material is TiO$_2$ which is applied to a thickness of $\frac{1}{4}$ wavelength by a sputter deposition process. For this embodiment the top-side electrode 40 need not be transparent.

By example, for a laterally-coupled PiN device constructed without the AR coating 58, and coupling only approximately 25% of the incident light, there is an approximately 25 times increase in responsivity over the vertically illuminated device shown in FIGS. 2a and 2b for the same bias conditions, that is −10V and input power of one milliwatt. This increase is 100 times for an input optical power of −20dBm. The dark current was found to be higher than that of the vertically illuminated embodiment of FIGS. 2a and 2b. The increase in dark current is believed to be related to the inclusion of AlGaAs in the temperature-grade regions 36a and 36b. While the dark current scales with device length, no change in responsivity for photodiode lengths greater than 50 micrometers is observed. This is consistent with the independent observation of the approximately 3% to 5% loss through the one micrometer thick i-layer 16 of the vertically illuminated device of FIGS. 2a and 2b.

QE may be further increased by the addition of a reflective coating 60 upon a surface of the device 50 that is opposite the input coupling surface. For this configuration, any radiation that passes through the GaAs:As layer 36 and that is not absorbed is reflected back through the layer 36, thereby increasing the probability of charge carrier generation. A suitable embodiment for the reflective coating 60 is an electrically insulating siO$_2$ layer coated with silver.

Using standard lock-in techniques it was found that, under forward bias, the photodiode current response begins to fall off in the 50 kHz range. However, in the reverse bias direction the photoresponse is extremely fast. Using excitation from a 1.3 micrometer wavelength, 0.5 psec pulse, the photoresponse was found not to exhibit an extended "tail". This observation suggests that the recombination mechanism is similar to that observed for electron-hole pairs with above-bandgap illumination, where the photoresponse decay time has been observed to be of the order of $2 \times 10^{-12}$ seconds.

An example of a method of growing the GaAs:As material is now provided for the PiN embodiment of FIG. 8.

EXAMPLE 1

The GaAs:As layer or film was grown with a Varian GEN II MBE system upon a two inch diameter liquid-encapsulated Czochralski n-type GaAs substrate.

The substrate 32 was degreased, etched in a 60° C. solution of 5:1:1 of H$_2$SO$_4$:H$_2$O$_2$:H$_2$O for one minute and placed in a nonbonded substrate mount. The substrate 32 was outgassed for two hours at 200° C. in the entry chamber of the MBE, moved to the buffer chamber where it was outgassed for one hour at 300° C., and then loaded into the growth chamber. In the growth chamber, the substrate 32 was heated to 615° C. for two minutes (the surface oxides desorbed at 580° C.) and then lowered to an initial growth temperature of 600° C.

The growth rates for all layers were one micrometer per hour with a Group V to Group III beam equivalent pressure of 16. The arsenic source was the dimer As$_2$. Initially, 0.8 micrometers of n-type GaAs was grown upon the substrate 32 to form the layer 34. The substrate temperature was then lowered from 600° to 250° C. during the growth of the next 0.25 micrometer of GaAs and the dopant source was turned off, thereby forming the temperature-grade layer 36a. After reaching a substrate temperature of 250° C., one micrometer of undoped GaAs was grown. This undoped GaAs layer is the LTBL i-layer 36. The substrate temperature was then ramped back to 600° C. and an additional 500 Angstroms of undoped GaAs was grown, thereby forming the temperature-grade layer 36b. This is followed by the growth of a p-doped GaAs layer 38 to a thickness of approximately 0.85 micrometers and the growth of a p+ GaAs capping layer 38a to a thickness of 50 Angstroms. At this point, growth was stopped by the removal of the Ga flux. The As flux was not interrupted. The high temperature anneal was then performed by leaving the sample at 600° C. for 30 minutes under the As flux, at a normal As flux growth level. This last step converts LTBL 36 to GaAs:As, i.e., GaAs with arsenic precipitates.

An example of a method of growing the GaAs:As material is now provided for the PiN embodiment of FIG. 4.

EXAMPLE 2

The GaAs:As layer or film was grown with a Varian GEN II MBE system upon a two inch diameter liquid-encapsulated Czochralski n-type GaAs substrate.

The substrate 32 was degreased, etched in a 60° C. solution of 5:1:1 of H$_2$SO$_4$:H$_2$O$_2$:H$_2$O for one minute and placed in a nonbonded substrate mount. The substrate 32 was outgassed for two hours at 200° C. in the entry chamber of the MBE, moved to the buffer chamber where it was outgassed for one hour at 300° C., and then loaded into the growth chamber. In the growth chamber, the substrate 32 was heated to 615° C. for two minutes (the surface oxides desorbed at 580° C.) and then lowered to an initial growth temperature of 600° C.

The growth rates for all layers were one micrometer per hour with a Group V to Group III beam equivalent pressure of 16. The arsenic source was the dimer $As_2$. Initially, 4000 Angstroms of n-type AlGaAs was grown to form the waveguiding layer 52. Layer 52 was doped with Si at a concentration of $10^{18}$ atoms $cm^{-3}$. Next, 1.0 micrometer of n-type GaAs was grown upon the layer 52 to form the layer 34. Layer 34 was doped with Si at a concentration of $10^{16}$ atoms $cm^{-3}$. These two growth steps occur in the region labeled "A" in FIG. 11a. Referring to regions "B" and "C" in FIG. 11a, the dopant source was turned off and the substrate temperature was lowered from 600° C. to 250° C. and then ramped back up to 600° C. while continuing growth using the Ga and As sources. Region B has a duration of 15 minutes and region C a duration of 3 minutes. This resulted in the growth of a substantially undoped 0.25 micrometer LTBL of GaAs, corresponding to the optically active i-layer 36. After reaching a substrate temperature of 600° C., Region "D" in FIG. 11a, one micrometer of p-type GaAs was grown to form the layer 38. Layer 38 was doped with Be at a concentration of $10^{18}$ atoms $cm^{-3}$. Next, 4000 Angstroms of p-type AlGaAs was grown to form the waveguiding layer 54. Layer 54 was doped with Be at a concentration of $10^{18}$ atoms $cm^{-3}$. This was followed by the growth of a p+ GaAs capping layer (not shown in FIG. 4) to a thickness of 50 Angstroms. The capping layer was doped with Be at a concentration of $10^{19}$ atoms $cm^{-3}$. At this point, growth was stopped by the removal of the Ga flux. The As flux was not interrupted. The high temperature anneal was then performed by leaving the sample at 600° C. for 30 minutes under the As flux, at a normal As flux growth level. This last step converts LTBL 36 to GaAs:As, i.e., GaAs with arsenic precipitates.

The fabrication method described in Example 2 provides, for the transversely illuminated embodiment, a thin GaAs:As layer that beneficially locates the precipitates near to the n-type and p-type collection layers 34 and 38. The length of the i-layer 36 may be made several hundred micrometers to increase absorption efficiency. The use of an AR coating and a reflector is also preferable to further increase efficiency.

FIG. 11b illustrates the growth conditions embodied in Example 1, wherein the temperature is maintained at approximately 250° C. for a period of time so as to grow the LTBL to a desired thickness.

For a TEM observation, (011) cross-sectional samples were prepared by Ar ion thinning. A JEM 2000 EX electron microscope with an ultrahigh resolution objective lens pole piece was used. The spherical aberration coefficient of the pole piece is 0.7 mm which yields a point resolution of 2.0 A.

Bright field images of cross-sectional samples showed a large number of small particles (As precipitates) having a nearly uniform distribution in the area corresponding to the LTBL. Diameters of observed particles range from approximately 20 Angstroms to approximately 200 Angstroms, and the particle (precipitate) density was on the order of approximately $10^{17}$ precipitates $cm^{-3}$ to approximately $10^{18}$ precipitates $cm^{-3}$.

It is noted that despite the existence of the large number of particles or inclusions that no significant defects, such as dislocation lines or dislocation loops, were found in the crystal lattice of the sample material, including the LTBL, as were observed in the previously cited work with $CoSi_2$.

By analyzing diffraction patterns and high resolution electron microscope (HREM) images, these particles were identified as consisting essentially of elemental arsenic having a hexagonal structure with lattice parameters of a =3,760 Angstroms and c=10.548 Angstroms. The HREM images suggest that the shapes of the arsenic precipitates are spherical or ellipsoidal, without exhibiting well-defined boundary planes.

In previous TEM studies, A. G. Cullis et al., J. Appl. Phys. 51, 2556 (1980) and B. T. Lee et al., J. Appl. Phys. 65, 1030 (1989), the existence of elemental arsenic precipitates were found in annealed arsenic-rich bulk GaAs crystals.

Diffraction patterns and HREM images of those arsenic particles appear to be similar to the precipitates observed in the LTBL grown in accordance with the invention. There is, however, one important distinction. In the annealed bulk GaAs crystals previously characterized the arsenic precipitates are always observed along dislocation lines or inside dislocation loops, which is explained as a result of preferential nucleation of arsenic precipitates on these defects. However, in the LTBL grown in accordance with the invention, no such defects are found around the arsenic precipitates. The arsenic precipitates in the LTBL are instead surrounded by a substantially perfect GaAs crystal lattice structure and are uniformly distributed throughout the LTBL. This preservation of crystalline order and uniform distribution of the As precipitates is an important factor in realizing the high performance photodetector embodiments described above, such as the low value of the dark current.

It is also noted that the formation of arsenic precipitates is believed to occur even at temperatures considerably higher than the growth temperature of the LTBL (250° C.), and that the density and sizes of the precipitates have a direct correlation with the substrate temperature during the growth of the GaAs. As such, the fabrication of the high quality GaAs:As material is not to be considered to be limited to only the specific parameters disclosed in the processing examples provided above.

Figure 6A:
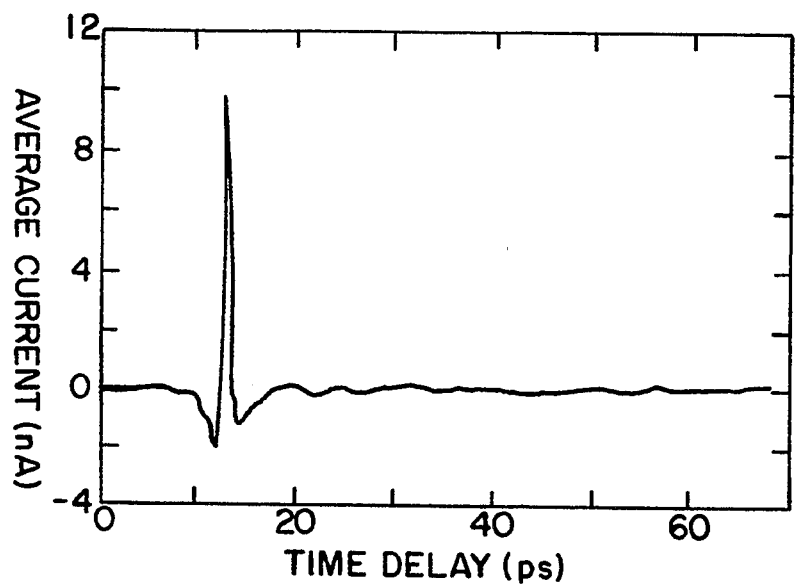
FIG. 6a is a graph that plots average current in nanoamps against time delay in picoseconds and illustrates a measured negative integral of a TeraHz pulse that is incident upon the photodetector of the invention.
Figure 6B:
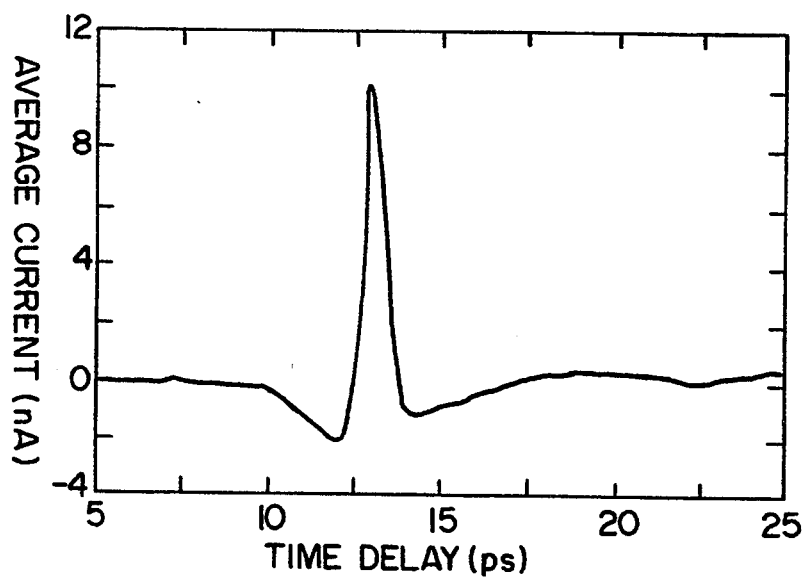
FIG. 6b is a graph that plots average current in nanoamps against time delay in picoseconds and illustrates a measured negative integral of the TeraHz pulse on an expanded time scale.
Figure 6C:
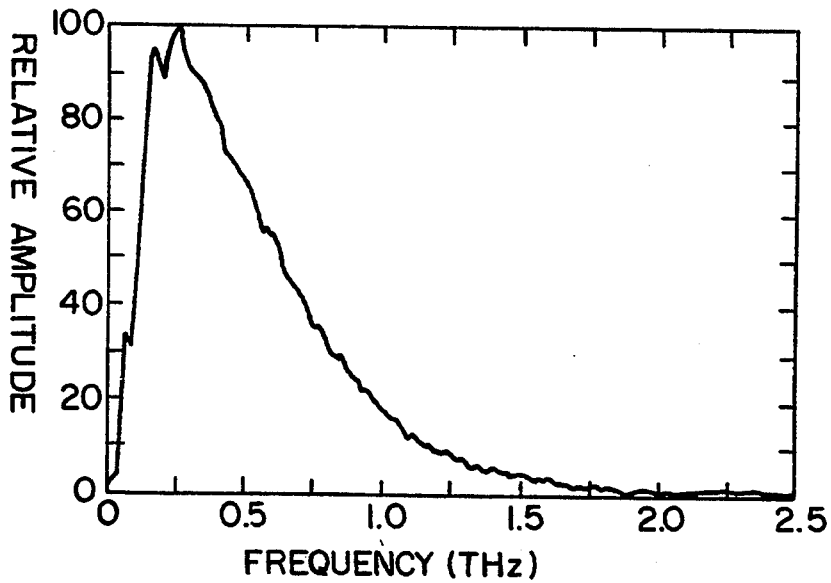

The performance of the GaAs:As material as an ultrafast photoconductive switch was demonstrated using a broad-band optoelectronic TeraHz beam system of a type described in an article entitled "Characterization of an Optoelectronic Beam System". IEEE Transactions on Microwave Theory and Techniques, Vol. 38, No. 11, 1684 (1990) by M. vanExter and D. R. Grischkowsky. The only significant difference between the system reported in the article and the performance test described herein was the substitution of GaAs:As (with Au:Ge:Ni contacts and antennae) for the implanted Silicon-on-Sapphire (SOS) described in the article. Patterned photoconductive gaps and transmission lines had spacings of 5 and 30 micrometers, respectively. The transmitter was biased at 9 volts and driven with 70 femtosecond optical pulses with a 100 MHz repetition rate. This radiation was focused on the receiver antenna which is gated by identical, but time-delayed, photoexcitation pulses. The results of this measurement are depicted in FIGS. 6a, 6b, and 6c. The GaAs:As photoconductive response was found to resemble a step function having an ultrafast sub-picosecond risetime followed by a relatively slow decay of several picoseconds. Thus, the temporal overlap between the incident teraHz pulse, which biases the gap of the receiver antenna, and the step-function photoconductive response of the receiver results in a transfer of charge (current) across the photoconductive gap that is proportional to the negative integral of the electric field of the incoming sub-picosecond electromagnetic pulse.

As can be seen in FIG. 6b, a full-width at-half-maximum (FWHM) of the integral pulse was found to be 0.71 psec, compared to 0.54 psec for sampling mode measurements using ion-implanted SOS in the same TeraHz beam system. However, a significant difference is that a measured peak signal (current) was found to be more than five times larger than that obtained from the all-SOS system. Furthermore, by comparing noise levels in the GaAs:As and SOS receivers it is estimated that the photoexcitation decay in the GaAs:As is on the order of two picoseconds, a time that is consistent with mediation by sparse As clusters, rather than a high density of bulk defects as is found in SOS.

It is also within the scope of the invention to provide GaAs having inclusions comprised of chromium or aluminum, and to construct high performance photodetectors therefrom in a manner described above.

The formation of a matrix of GaAs with either Al or Cr inclusion is accomplished as follows. After normal MBE growth of a layer of GaAs between 20 nm and 200 nm thick, at a temperature of approximately 600° C. to 650° C., the growth is interrupted and the Ga, As, and dopant sources are shuttered. To generate Cr inclusions, between 5 and 10 monolayers of Cr are deposited on the 600°-650° C. GaAs surface. The Cr coalesces into "islands". Next, normal MBE growth of 20–200nm of GaAs is continued. The Cr islands are buried in the GaAs matrix as Cr inclusions. The Cr inclusions act as buried Schottky barriers in accordance with the invention. This cycle is repeated as many times as is necessary to generate a matrix of desired thickness. To generate Al inclusions, several monolayers of AlAs are grown by normal MBE on the GaAs layer prior to growth interruption. Next, with the Ga, As, and dopants shuttered, between 5 and 10 monolayers of Al are deposited on the 600°-650° C. AlAs surface. The Al coalesces into "islands". Next several monolayers of AlAs are grown by normal MBE and the AlAs conformally coats the Al islands. Next, 20–200 nm of GaAs is grown by normal MBE to bury the Al islands in the GaAs matrix. This cycle is repeated as many times as is necessary to generate a matrix of desired thickness.

In general, any metal may be employed that has a desired work function and that has a sufficient surface mobility to form islands, including niobium.

Referring to FIG. 10 there is shown in cross section a further embodiment of the GaAs:As layer 36 for use in a transversely illuminated configuration, such as in the device of FIG. 4. FIG. 10 illustrates an embodiment wherein the inclusions are distributed within the compound semiconductor material in accordance with a predetermined concentration gradient. For the illustrated example the inclusions have a concentration that varies through the thickness of the layer 36. This configuration is useful, for example, for optimizing the concentration of the buried Schottky barriers of the radiation detecting active layer 36 to the spatial distribution of the received light. By example, the highest As cluster density is predetermined to occur at the peak of the optical field for the transversely injected pulse. As depicted in FIG. 10, the peak of the optical field is shown to occur near to the edges of the radiation absorbing layer 36. The precipitate concentration is thus increased in these regions so as to increase the probability of detecting the light. Furthermore, this concentration distribution increases the probability that the charge carriers will be collected by the adjacent n and p layers 34 and 38.

To obtain the concentration gradient of FIG. 10 the above described fabrication process can be modified so as to increase the deposition temperature for the region or regions of the GaAs:As layer wherein a lower inclusion concentration is desired. The end result is a preferential formation of inclusions, during the subsequent high temperature anneal, only in those regions wherein low temperature growth occurred.

It should be apparent that by changing the bandgap of the host material and/or the Schottky barrier height of the inclusions that the sensitivity of the device can be shifted to longer or shorter wavelengths.

It should also be realized that semi-metals may also be employed as precipitates. For example As is known to act as a semi-metal under certain circumstances. Thus, as employed herein the term metallic precipitates is intended to encompass both metallic and semi-metallic elements.

Furthermore, although described in context of discrete devices, it should be realized that the teaching of the invention may also be employed to construct linear and two-dimensional arrays of optically responsive devices.

Also, while there is no intent to limit the scope of the invention by the theory presented above, this theory is believed to be accurate and consistent with observable facts and accepted scientific principles.

Thus, while the invention has been particularly shown and described with respect to preferred embodiments thereof, it will be understood by those skilled in the art that changes in form and details may be made therein without departing from the scope and spirit of the invention.

Having thus described our invention, what we claim as new, and desire to secure by Letters Patent is:

1. A body comprised of a compound semiconductor material having metallic particulate inclusions that are dispersed within a crystal lattice of said compound semiconductor material, substantially all of said metallic particulate inclusions being completely surrounded by said compound semiconductor material and physically separated from one another and from external surfaces of said body of compound semiconductor material, said metallic particulate inclusions having a Schottky barrier height of a magnitude sufficient for generating detectable charge carriers in response to electromagnetic radiation having a photon energy that is less than a bandgap energy of said compound semiconductor material.

2. A body as set forth in claim 1 wherein said compound semiconductor material is comprised of a Group III-V compound semiconductor material, and wherein said metallic particulate inclusions are comprised of a constituent element of the compound semiconductor material.

3. A body as set forth in claim 2 wherein said compound semiconductor material is comprised of GaAs, and wherein said metallic particulate inclusions are comprised of As.

4. A body as set forth in claim 1 wherein said compound semiconductor material is comprised of GaAs, and wherein said metallic particulate inclusions are comprised of Al.

5. A body as set forth in claim 1 wherein said compound semiconductor material is comprised of GaAs, and wherein said metallic particulate inclusions are comprised of Cr.

6. A body as set forth in claim 1 wherein said metallic particulate inclusions are dispersed within the crystal lattice of said compound semiconductor material in such a manner that the crystal lattice is substantially free of twins and stacking faults.

7. A body as set forth in claim 1 wherein the Schottky barrier height for n-conductivity compound semiconductor material is approximately one half of the bandgap energy of the compound semiconductor material.

8. A body as set forth in claim 3 wherein substantially all of the metallic particulate inclusions have a radius within a range of approximately 20 angstroms to approximately 200 angstroms, and wherein the metallic particulate inclusions are present in a concentration of approximately $10^{16}$ particulate inclusions cm$^{-3}$ to approximately $10^{18}$ particulate inclusions cm$^{-3}$.

9. A body comprised of a compound semiconductor material having metallic particulate inclusions dispersed within a crystal lattice of said compound semiconductor material, substantially all of said metallic particulate inclusions being completely surrounded by said compound semiconductor material and physically separated from one another and from external surfaces of said body of compound semiconductor material, said metallic particulate inclusions having a Schottky barrier height of a magnitude sufficient for generating detectable charge carriers in response to electromagnetic radiation having a wavelength equal to or less than approximately 1.6 micrometers.

10. An optically active device comprising a radiation absorbing region that is comprised of a region of compound semiconductor material having a plurality of metallic particulate inclusions contained therein, substantially all of said metallic particulate inclusions being completely surrounded by said compound semiconductor material and physically separated from one another and from external surfaces of said region of compound semiconductor material, said metallic particulate inclusions rendering said compound semiconductor material substantially electrically nonconducting in the absence of illumination.

11. An optically active device as set forth in claim 10 wherein the radiation absorbing region is comprised of GaAs, and wherein the metallic particulate inclusions are each comprised of As.

12. An optically active device as set forth in claim 11 wherein substantially all of the metallic particulate inclusions have a radius within a range of approximately 20 angstroms to approximately 200 angstroms.

13. An optically active device as set forth in claim 11 wherein the metallic particulate inclusions are present in a concentration of approximately $10^{16}$ particulate inclusions cm$^{-3}$ to approximately $10^{18}$ particulate inclusions cm$^{-3}$.

14. An optically active device as set forth in claim 10 wherein the metallic particulate inclusions are responsive to radiation having a wavelength equal to or less than approximately 1.6 micrometers for absorbing the radiation and for rendering said compound semiconductor material electrically conducting.

15. An optically active device as set forth in claim 10 wherein the metallic particulate inclusions are each comprised of Al.

16. An optically active device as set forth in claim 10 wherein the metallic particulate inclusions are each comprised of Cr.

17. An optically active device as set forth in claim 10 wherein said radiation absorbing region is intentionally doped.

18. An optically active device as set forth in claim 10 wherein said radiation absorbing region is intentionally undoped.

19. An optically active device as set forth in claim 10 and further comprising an n-type region and a p-type region, and wherein said radiation absorbing region is interposed between, and is electrically coupled to, said n-type region and said p-type region.

20. An optically active device as set forth in claim 19 wherein incident radiation enters said radiation absorbing region along an axis that passes through said n-type region and through said p-type region.

21. An optically active device as set forth in claim 19 wherein incident radiation enters said radiation absorbing region along an axis that does not pass through said n-type region or through said p-type region.

22. An optically active device as set forth in claim 10 and further comprising an anti-reflection coating this is disposed upon a radiation receiving surface of said optically active device.

23. An optically active device as set forth in claim 10 and further comprising a reflective coating that is disposed relative to a surface of said radiation absorbing region for reflecting radiation that passes through said radiation absorbing region, without being absorbed, back into said radiation absorbing region.

24. An optically active device as set forth in claim 10 and further comprising a plurality of ohmic contacts that are electrically coupled to said radiation absorbing region.

25. An optically active device as set forth in claim 10 and further comprising a plurality of Schottky barrier contacts that are electrically coupled to said compound semiconductor material of said radiation absorbing region.

26. An optically active device as set forth in claim 10 and further comprising a plurality of interdigitated electrical contacts that are electrically coupled to said radiation absorbing region.

27. An optically active device as set forth in claim 10 and further including an optical fiber that is optically coupled to said radiation absorbing region for providing incident radiation thereto.

28. An optically active device as set forth in claim 10 wherein said metallic particulate inclusions are substantially uniformly distributed throughout said compound semiconductor material.

29. An optically active device as set forth in claim 10 wherein said metallic particulate inclusions are distributed within said compound semiconductor material in accordance with a predetermined concentration distribution.

30. An optically active device as set forth in claim 10 wherein, with an applied forward bias of approximately +10V, at a temperature of approximately 295K, said device has a dark current of less than approximately 400 microamp/cm$^2$.

31. A PiN photodiode comprising:
a substrate;
a first compound semiconductor material layer disposed above said substrate and having a first type of electrical conductivity;
an intrinsic compound semiconductor material layer disposed above said first compound semiconductor material layer, said intrinsic compound semiconductor material layer including a plurality of buried Schottky barriers, said buried Schottky barriers being completely surrounded by the intrinsic compound semiconductor material and physically separated from one another and from external surfaces of said intrinsic compound semiconductor layer; and
a second compound semiconductor material layer disposed above said intrinsic compound semiconductor material layer and having a second type of electrical conductivity.

32. A PiN photodiode as set forth in claim 31 and further including:
a first waveguiding layer interposed between said first compound semiconductor material layer and said substrate; and
a second waveguiding layer disposed over said second compound semiconductor material layer.

33. A PiN photodiode as set forth in claim 31 wherein said intrinsic compound semiconductor material layer is comprised of GaAs, and wherein each of the buried Schottky barriers is associated with one of a plurality of elemental As particulate inclusions that are dispersed within the GaAs.

34. A PiN photodiode as set forth in claim 33 wherein each of the elemental As particulate inclusions has a radius within a range of approximately 20 angstroms to approximately 200 angstroms, and wherein the elemental As particulate inclusions are present at a concentration of approximately $10^{16}$ particulate inclusions cm$^{-3}$ to approximately $10^{18}$ particulate inclusions cm$^{-3}$.

35. A PiN photodiode as set forth in claim 33 wherein the elemental As particulate inclusions are responsive to radiation having a wavelength equal to or less than approximately 1.6 micrometers for absorbing the radiation and for rendering said intrinsic compound semiconductor material electrically conducting.

36. A PiN photodiode as set forth in claim 31 and further comprising an anti-reflection coating disposed over a radiation receiving surface of said intrinsic compound semiconductor material layer.

37. A PiN photodiode as set forth in claim 36 and further comprising a reflective coating disposed over a surface of said intrinsic compound semiconductor material layer that is opposite said radiation receiving surface, said reflective coating reflecting radiation that passes through said intrinsic compound semiconductor material layer back into said intrinsic compound semiconductor material layer.

38. A body of material comprised of Group III-V elements having metallic particulate inclusions consisting essentially of either a Group III element or a Group V element, said metallic particulate inclusions each having a diameter within a range of approximately 20 Angstroms to approximately 200 Angstroms and a concentration within said material within a range of approximately $10^{16}$ particulate inclusion cm$^{-3}$ to approximately $10^{18}$ particulate inclusions cm$^{-3}$, substantially all of said metallic particulate inclusions being totally surrounded by said material and dispersed within a crystal lattice of said material in such a manner that the crystal lattice is not significantly defected, substantially all of said metallic particulate inclusions being physically separated from one another and from external surfaces of said body of material.

39. A material as set forth in claim 38 wherein said material is comprised of GaAs, and wherein said metallic particulate inclusions consist essentially of elemental As.

40. A material as set forth in claim 38 wherein said material is comprised of GaAs, and wherein said metallic particulate inclusions consist essentially of elemental Al.

41. A compound semiconductor material containing particulates comprised of metallic precipitates each having a diameter within a range of approximately 20 Angstroms to approximately 200 Angstroms and a concentration within said material within a range of approximately $10^{16}$ particulates cm$^{-3}$ to approximately $10^{18}$ particulates cm$^{-3}$, substantially all of said particulates being completely surrounded by the compound semiconductor material, substantially all of said particulates being physically separated from one another and from external surfaces of said body of material, the compound semiconductor material being doped with an acceptor dopant or with a donor dopant at a concentration within a range of approximately $10^{16}$ dopant atoms cm$^{-3}$ to approximately $10^{18}$ dopant atoms cm$^{-3}$ wherein the compound semiconductor material exhibits an electrical conductivity, in the absence of illumination, that is substantially less than an electrical conductivity of an equivalently doped compound semiconductor material that does not contain a significant number of said particulates.

* * * * *